(12) United States Patent
Kobayashi et al.

(10) Patent No.: US 8,183,873 B2
(45) Date of Patent: May 22, 2012

(54) CONTACT SENSOR UNIT, ELECTRONIC DEVICE, AND METHOD FOR PRODUCING A CONTACT SENSOR UNIT

(75) Inventors: Hiroshi Kobayashi, Kawasaki (JP); Toru Okada, Kawasaki (JP); Yasutoshi Furukawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 429 days.

(21) Appl. No.: 12/487,885

(22) Filed: Jun. 19, 2009

(65) Prior Publication Data

US 2010/0097080 A1    Apr. 22, 2010

(30) Foreign Application Priority Data

Oct. 22, 2008    (JP) ................. 2008-272125

(51) Int. Cl.
*G01R 27/26*    (2006.01)
(52) U.S. Cl. ........................ 324/658; 324/662
(58) Field of Classification Search .................. 324/658, 324/662, 663
See application file for complete search history.

(56) References Cited

U.S. PATENT DOCUMENTS

| | | |
|---|---|---|
| 7,015,579 B2 | 3/2006 | Okada et al. |
| 2004/0188838 A1 | 9/2004 | Okada et al. |
| 2005/0031174 A1* | 2/2005 | Ryhanen et al. ............ 382/124 |
| 2006/0006511 A1 | 1/2006 | Roh et al. |
| 2007/0086630 A1* | 4/2007 | Setlak et al. ................ 382/124 |

FOREIGN PATENT DOCUMENTS

| | | |
|---|---|---|
| CN | 1719590 A | 1/2006 |
| CN | 1828880 A | 9/2006 |
| JP | 64-044030 A | 2/1989 |
| JP | 03-006036 A | 1/1991 |
| JP | 09-232474 A | 9/1997 |
| JP | 11-345890 A | 12/1999 |
| JP | 2000-003935 A | 1/2000 |
| JP | 2004-304054 A | 10/2004 |

OTHER PUBLICATIONS

Chinese Office Action dated Nov. 23, 2011, issued in corresponding Chinese Patent Application No. 200910163927.6.

* cited by examiner

*Primary Examiner* — Vincent Q Nguyen
(74) *Attorney, Agent, or Firm* — Westerman, Hattori, Daniels & Adrian, LLP

(57) ABSTRACT

A contact sensor unit includes: a flexible substrate having a conductive pattern; a sensor element having a detecting surface for detecting a fingerprint of a test subject, the sensor element having a terminal electrically connected to the conductive pattern, and the sensor element mounted on the flexible substrate to be covered with the flexible substrate; and a reinforcing member fixed on the flexible substrate and surrounding the sensor element.

9 Claims, 13 Drawing Sheets

US 8,183,873 B2

CONTACT SENSOR UNIT, ELECTRONIC DEVICE, AND METHOD FOR PRODUCING A CONTACT SENSOR UNIT

CROSS-REFERENCE TO RELATED APPLICATION

This application is based upon and claims the benefit of priority of the prior Japanese Patent Application No. 2008-272125, filed on Oct. 22, 2008, the entire contents of which are incorporated herein by reference.

FIELD

The embodiments discussed herein are related to a contact sensor unit, an electronic device, and a method for producing the contact sensor unit.

BACKGROUND

There has been known a fingerprint sensor used for fingerprint authentication. The fingerprint sensor has a sensor element. A test subject pushes his/her finger onto a detecting surface of the sensor element, so that the fingerprint of the test subject is read.

The fingerprint sensor is one of contact sensors and is repeatedly pressured by a finger of a test subject. Further, in a case where the fingerprint sensor is installed in a portable device or the like, when the portable device is shocked, the fingerprint sensor is also shocked. Such an external force may break the sensor element.

SUMMARY

According to an aspect of the embodiment, a contact sensor unit includes: a flexible substrate having a conductive pattern; a sensor element having a detecting surface for detecting a fingerprint of a test subject, the sensor element having a terminal electrically connected to the conductive pattern, and the sensor element mounted on the flexible substrate to be covered with the flexible substrate; and a reinforcing member fixed on the flexible substrate and surrounding the sensor element.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 1A to 11C are explanatory views of the variation of the fingerprint sensor according to the second embodiment;

DESCRIPTION OF EMBODIMENTS

A description will be given of embodiments with reference to the accompanying drawings.

First Embodiment

A description will be given of a fingerprint sensor as an example of a contact sensor unit.

Figure 1:
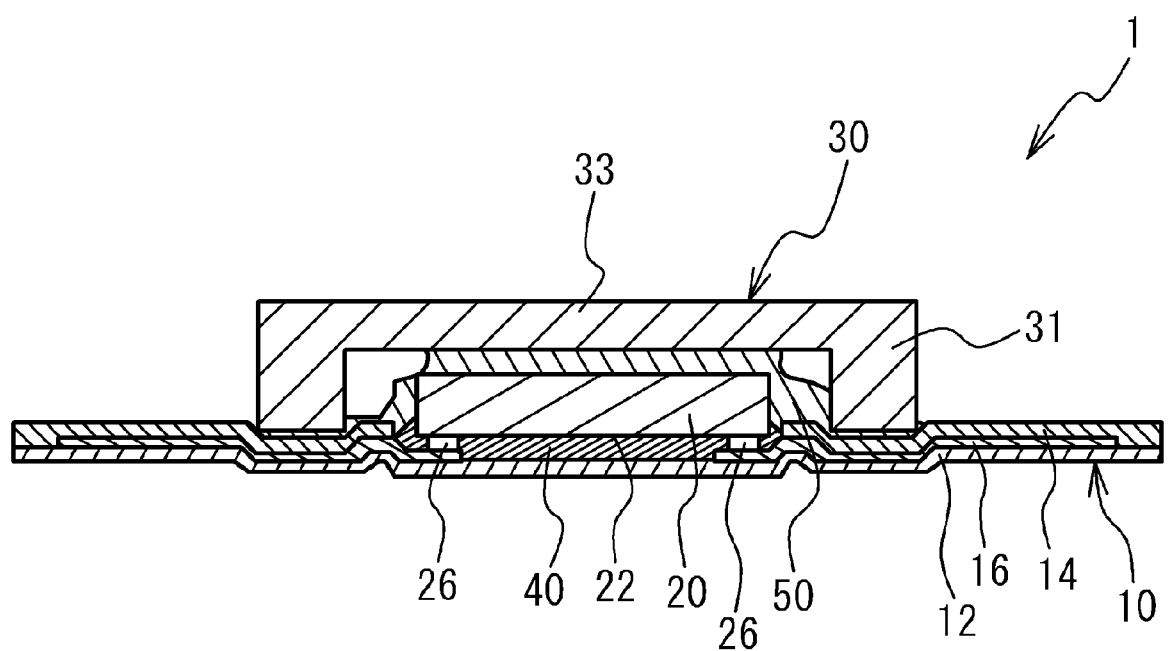
FIG. 1 is a cross sectional view of a fingerprint sensor according to a first embodiment.

FIG. 1 is a cross sectional view of a fingerprint sensor 1 according to a first embodiment. The fingerprint sensor 1 includes a FPC (flexible substrate) 10, a sensor element 20 mounted on the FPC 10, and a reinforcing member 30. The FPC 10 has conductive patterns. The sensor element 20 is electrically connected to the conductive patterns of the FPC 10 via bumps (terminals) 26.

The sensor element 20 has a detecting surface 22 being capable of sensing a fingerprint of a person being tested. The detecting surface 22 is covered with the FPC 10. The sensor element 20 is a semiconductor chip, but is not limited to this. Fingerprint sensing type of the sensor element 20 is electrostatic capacity type.

The detecting surface 22 includes a sensor film, and plural electrodes arranged in an array under the sensor film. When a test subject touches the sensor film surface, electric charges are stored in electrostatic capacitance varying depending on a length, changed by a fingerprint shape, between the electrodes and the finger surface. Voltage according to the stored electric charges and the electrostatic capacitance is generated in the electrodes. An electronic device equipped with the fingerprint sensor 1 performs a fingerprint authentication such that an image of the fingerprint is formed on the basis of the voltage generated in this way. Additionally, the method of detecting a fingerprint by use of the sensor element 20 is electrostatic capacity type, but may employ voltage, or any other type.

The reinforcing member 30 is mounted on the FPC 10 to surround the sensor element 20. The reinforcing member 30 has a case shape. The reinforcing member 30 is made of, for example, a synthetic resin. The reinforcing member 30 includes a pole portion 31 and a bottom portion 33.

An underfill material 40 is filled between the FPC 10 and the detecting surface 22 of the sensor element 20. Further, a resin 50 is filled between the sensor element 20 and the reinforcing member 30. The reinforcing member 30 is fixed on the FPC 10 with the resin 50.

In FIG. 1, the lower surface of the FPC 10 is swept by a finger of a test subject. A test subject sweeps the FPC 10, so that his/her fingerprint is read by the detecting surface 22 of the sensor element 20.

As illustrated in FIG. 1, the sensor element 20 is surrounded by the reinforcing member 30. This prevents an external force from being directly applied to the sensor element 20. Thus, the sensor element 20 can be prevented from being broken. For example, the sensor element 20 is protected from the impact applied to the electronic device equipped with the fingerprint sensor 1, or from the external force applied to the fingerprint sensor 1 when the fingerprint sensor 1 is transported.

Further, the underfill material 40 prevents the bump 26 from peeling from the FPC 10. The resin 50 filled between the sensor element 20 and the reinforcing member 30 also prevents the bump 26 from peeling from the FPC 10. These arrangements also suppress the influence of the external force applied to the fingerprint sensor 1.

The detecting surface 22 of the sensor element 20 is covered with the FPC 10. This prevents the detecting surface 22 from being scratched. Further, the detecting surface 22 is protected from moisture or stress. The underfill material 40 is filled between the FPC 10 and the detecting surface 22 of the sensor element 20, thereby also protecting the detecting surface 22.

Further, the fingerprint sensor 1 uses the FPC 10 thinner than a rigid substrate. Thus, the fingerprint sensor 1 is reduced in thickness. Also, the reinforcing member 30 has a case shape, thereby ensuring the contact area of the reinforcing member 30 with the resin 50.

The FPC 10 has: a conductor layer 16 formed with patterns; a protective layer 12 covering one surface of the conductor layer 16; and a protective layer 14 covering the other surface of the conductor layer 16. The protective layer 12 entirely covers one surface of the conductor layer 16. The conductor layer 16 is partially exposed from the protective layer 14. The bump 26 of the sensor element 20 is bonded to the exposed section of the conductor layer 16. The conductor layer 16 is not formed at a section opposite the detecting surface 22 of the sensor element 20. That is, the conductor layer 16 is formed to avoid facing the detecting surface 22. Thus, the underfill material 40 and the protective layer 12 are stacked on the detecting surface 22. In a case where many layers are stacked on the detecting surface 22, the detection accuracy of the fingerprint may be degraded. However, since two layers composed of the underfill material 40 and the protective layer 12 are stacked on the detecting surface 22, the detecting surface 22 is protected, while the detection accuracy of the fingerprint in the detecting surface 22 is ensured.

Further, the thickness of the FPC 10 is about 25 µm. In the conductor layer 16, wiring patterns are formed by plating or the like. The protective layers 12 and 14 are made of polyimide resins. The bumps 26 are formed by, for example, plating, pattern transferring, or the like.

Second Embodiment

Figure 2:
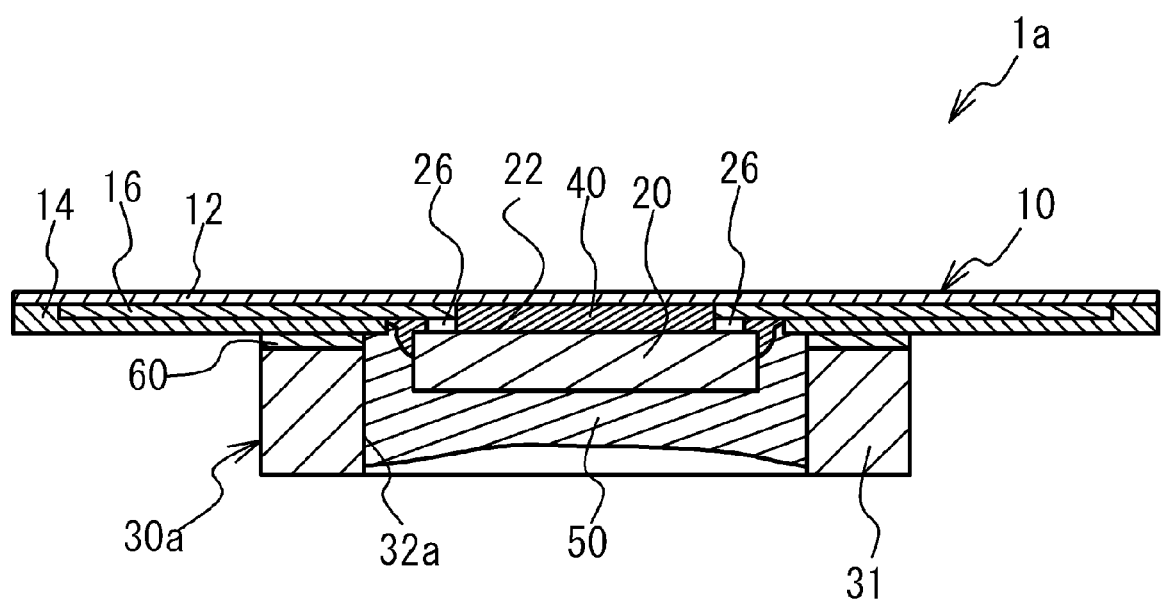
FIG. 2 is a cross-sectional view of a fingerprint sensor according to a second embodiment.

Next, a description will be given of a fingerprint sensor 1a according to a second embodiment. Additionally, the same components as the first embodiment have the same reference numerals in order to avoid a duplicated explanation. FIG. 2 is a cross-sectional view of the fingerprint sensor 1a according to a second embodiment.

A reinforcing member 30a has a frame shape. Unlike the reinforcing member 30a according to the first embodiment, the reinforcing member 30a does not have the bottom portion 33. Thus, the fingerprint sensor 1a is further reduced in thickness. In addition, the resin 50 is filled within the reinforcing member 30a so as to be not beyond a height of the pole portion 31. An inner side surface 32a of the reinforcing member 30a extends in the vertical direction.

Figure 3A:
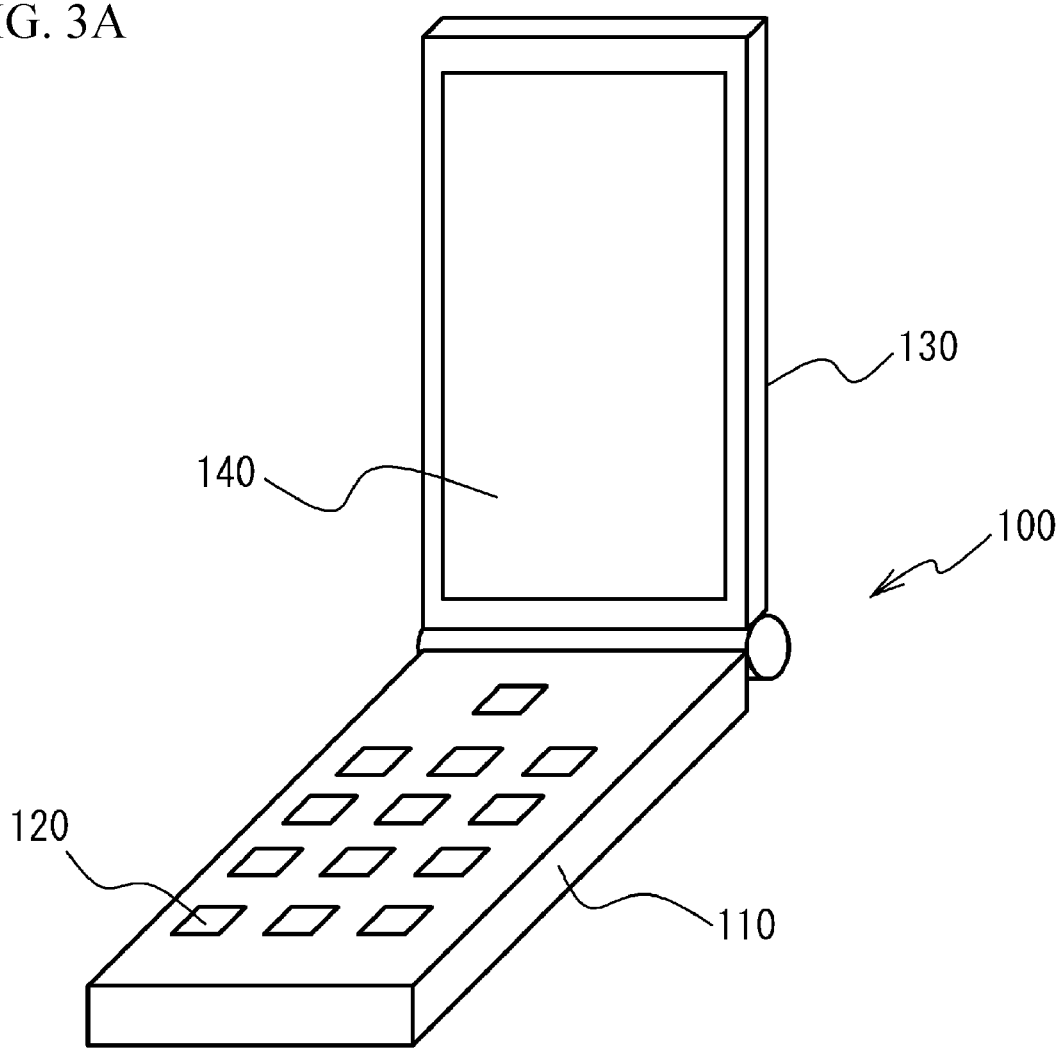
FIGS. 3A and 3B are explanatory views of a portable phone equipped with the fingerprint sensor.
Figure 3B:
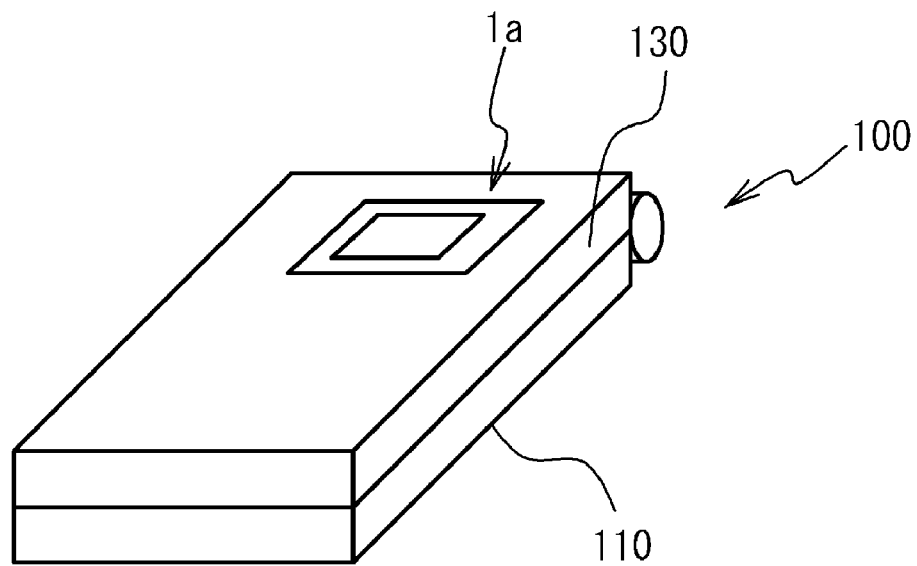

Next, a description will be given of a case where the fingerprint sensor 1a is installed in an electronic device. FIGS. 3A and 3B are explanatory views of a portable phone 100 equipped with the fingerprint sensor 1a. As illustrated in FIG. 3A, the portable phone 100 includes a main portion 110 and a display portion 130 which are foldably connected to each other. The main portion 110 is provided with input keys 120. The display portion 130 is provided with a display 140. FIG. 3B illustrates the portable phone 100 in the folded state. The fingerprint sensor 1a is installed at a rear side of the display portion 130.

Figure 4:
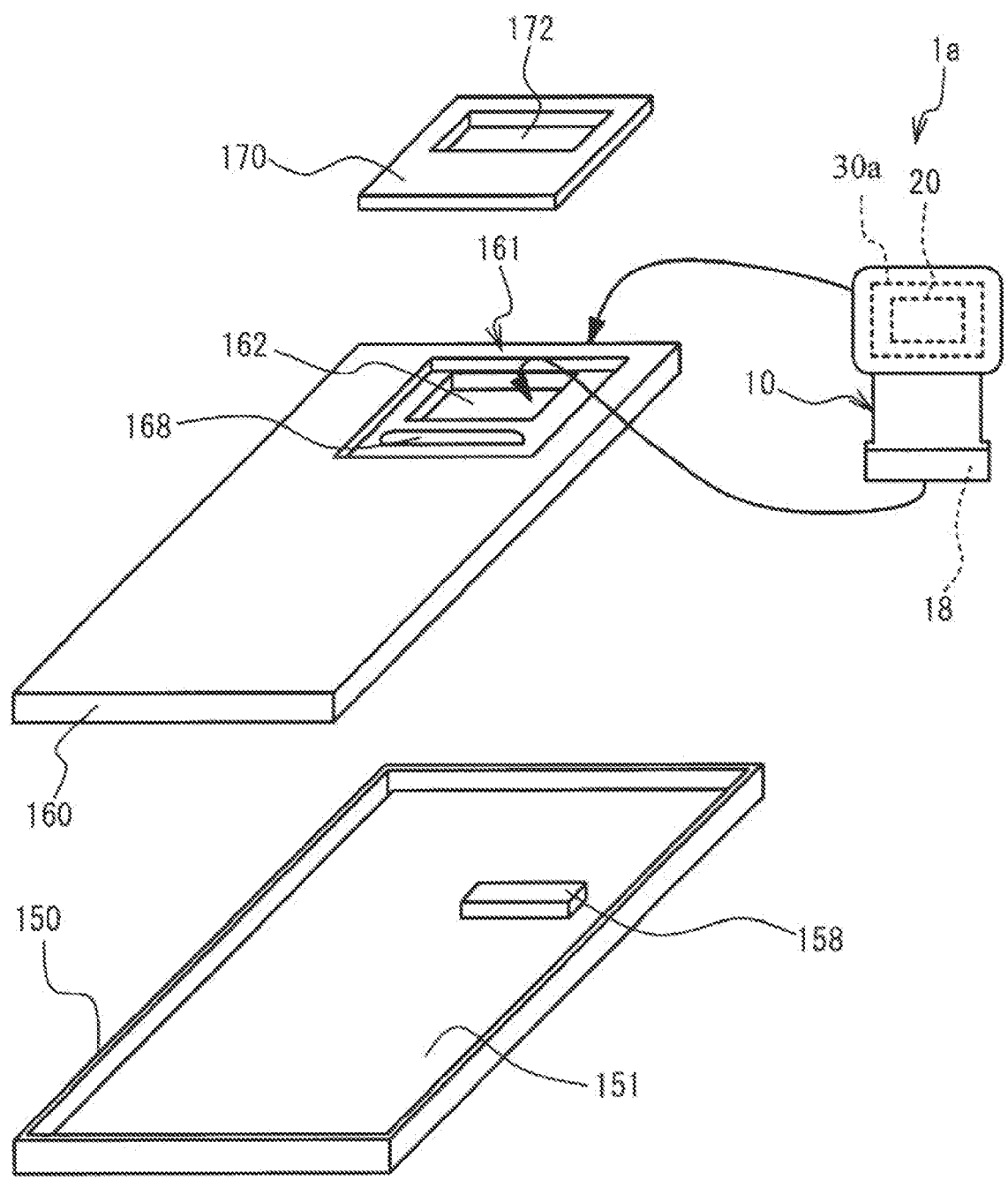
FIG. 4 is an exploded perspective view of the display portion.

FIG. 4 is an exploded perspective view of the display portion 130. The display portion 130 includes a front case 150, a rear case 160, and a cover 170. A printed substrate 151 is fixed on the front case 150. A connector 158 is mounted on the printed substrate 151. An attachment portion 161, to be attached with the fingerprint sensor 1a, is formed on the rear case 160.

The attachment portion 161 is formed with an escape hole 162 for escaping the reinforcing member 30a and an escape hole 168 for escaping the FPC 10. A terminal 18 formed at one end of the FPC 10 is connected to the connector 158 through the escape hole 168. This ensures the electrical connection of the fingerprint sensor 1a and the printed substrate 151. Additionally, the cover 170 attaches the fingerprint sensor 1a to the attachment portion 161. The cover 170 is provided with an opening 172. A test subject sweeps the FPC 10 exposed from the opening 172 with his/her finger, whereby the fingerprint is detected by the detecting surface 22 of the sensor element 20.

Figure 5:
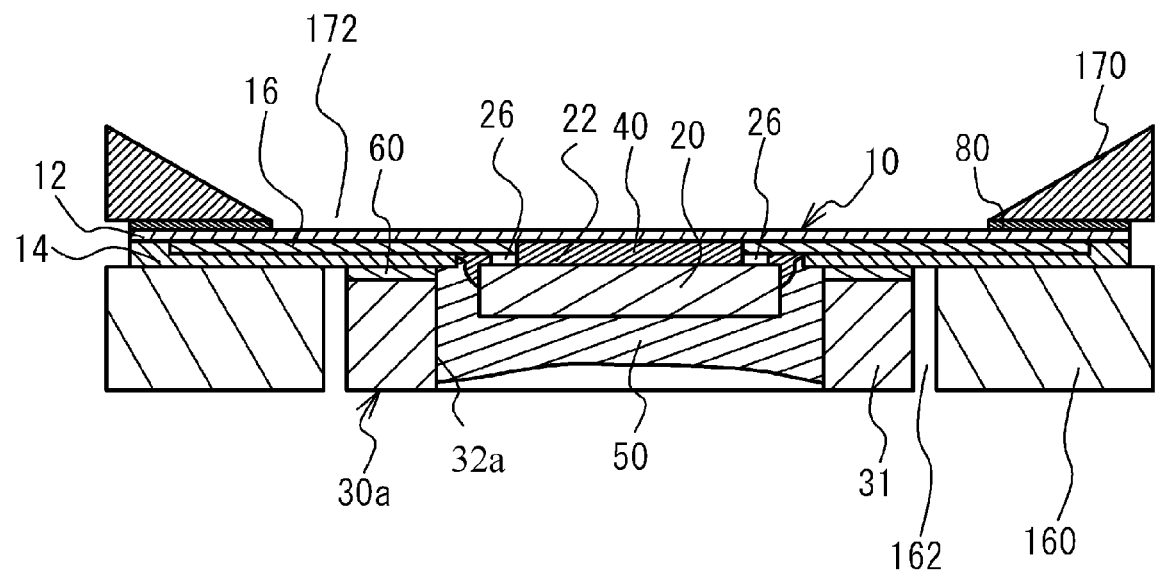
FIG. 5 is a cross-sectional view of the fingerprint sensor installed in the portable phone.

FIG. 5 is a cross-sectional view of the fingerprint sensor 1a installed in the portable phone 100. The FPC 10 is fixed to cover the escape hole 162 of the rear case 160. In addition, the FPC 10 and the cover 170 are bonded with a double-faced tape 80. The double-faced tape 80 has water resistance. In this manner, the FPC 10 fills a gap between the escape hole 162 and the reinforcing member 30a. Further, the cover 170 and the FPC 10 are bonded with the double-faced tape 80 having water resistance. This prevents the infiltration of water into the portable phone 100 via the opening 172. Additionally, this also prevents the infiltration of water into the fingerprint sensor 1a. In this manner, the fingerprint sensor 1a has improved water resistance.

Figure 6A:
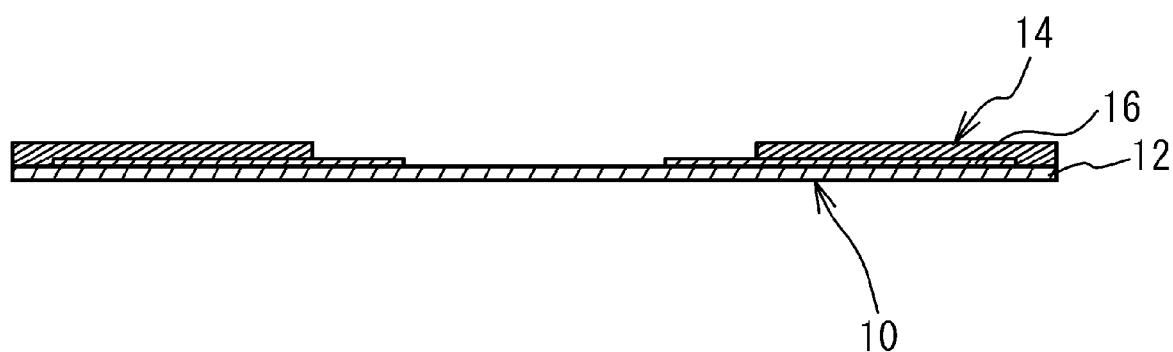
FIGS. 6A and 6B are explanatory views of the method for producing the fingerprint sensor.
Figure 6B:
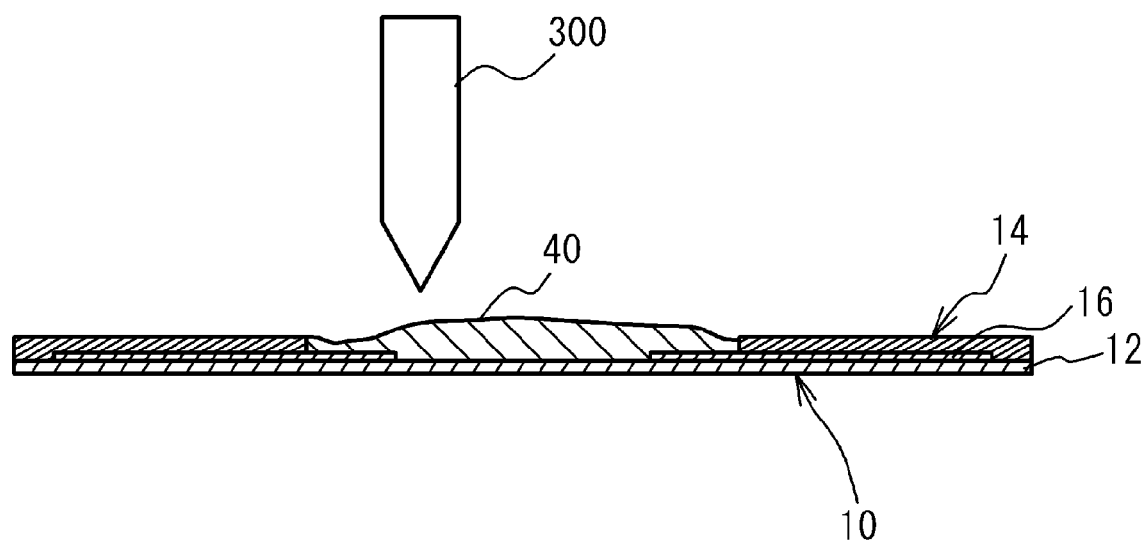
Figure 7A:
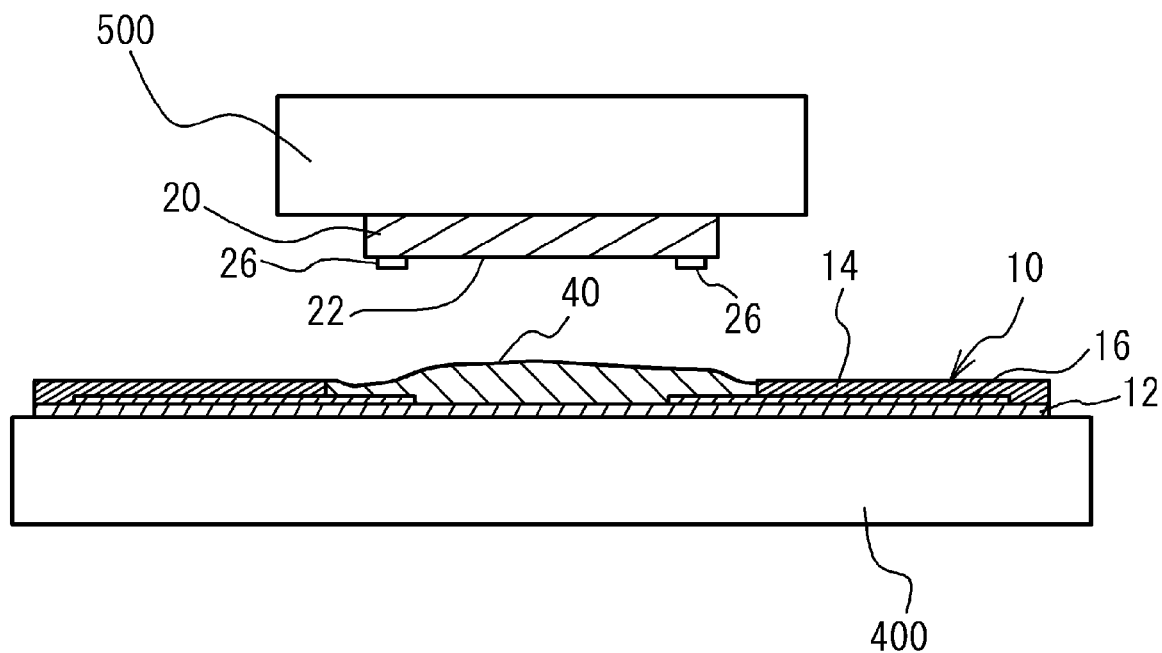
FIGS. 7A and 7B are explanatory views of the method for producing the fingerprint sensor.
Figure 7B:
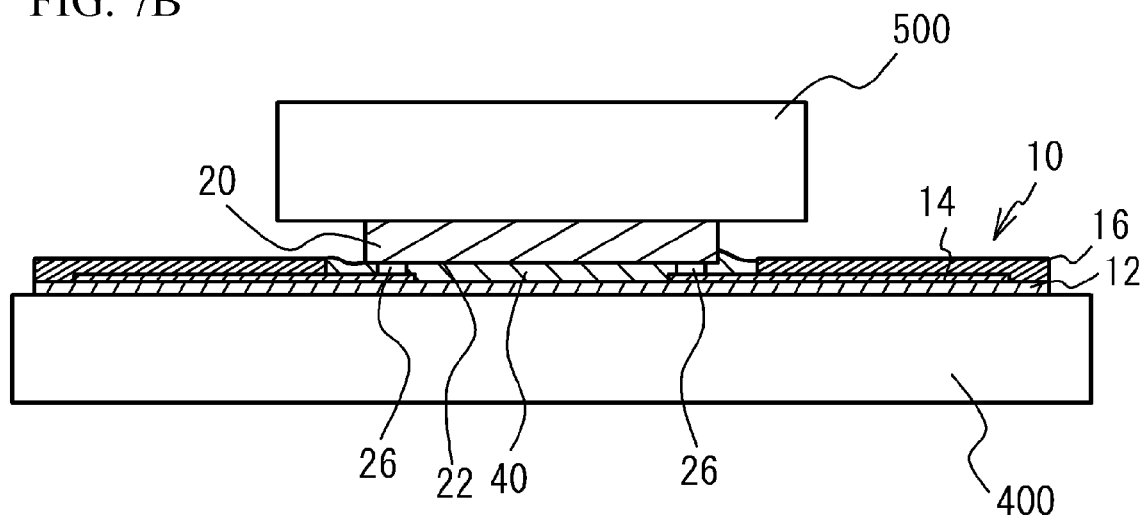

Next, a description will be given of a method for producing the fingerprint sensor 1a. FIGS. 6A, 6B, 7A, 7B, 8, and 9 are explanatory views of the method for producing the fingerprint sensor 1a. As illustrated in FIGS. 6A and 6B, the underfill material 40 is applied to the exposed portion of the conductor layer 16 and its vicinity by a dispense needle 300. Next, as illustrated in FIGS. 7A and 7B, the FPC 10 is displaced on a bonding stage 400, so the sensor element 20 is adsorbed by a bonding tool 500. The sensor element 20 is aligned with the FPC 10 to be flip-chip mounted on the FPC 10. The sensor element 20 and the FPC 10 are heated with the sensor element 20 pressurized toward the FPC 10, and the mounting is performed.

Figure 8:
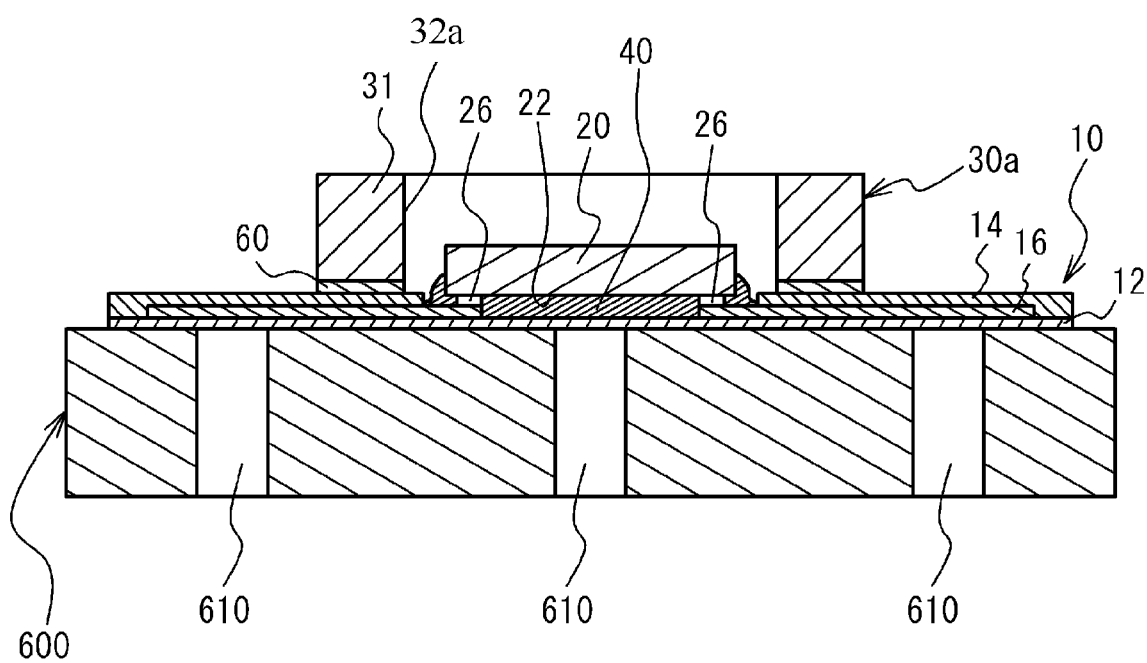
FIG. 8 is an explanatory view of the method for producing the fingerprint sensor.

Next, as illustrated in FIG. 8, the FPC 10 is adsorbed on an adsorption stage 600. The adsorption stage 600 is provided with plural vacuum holes 610. The vacuum holes 610 are brought to a vacuum state by suction of a pump, thereby fitting the FPC 10 on the adsorption stage 600. Thus, the FPC 10 is planarized. The reinforcing member 30a is fixed on the FPC 10 with an adhesive bond 60 while the adsorbed state is being maintained. Further, the adhesive bond 60 has, for example, a sheet shape. The adhesive bond 60 prevents the resin 50 from leaking out of a gap between the FPC 10 and the adhesive bond 60 at the time of potting.

Figure 9:
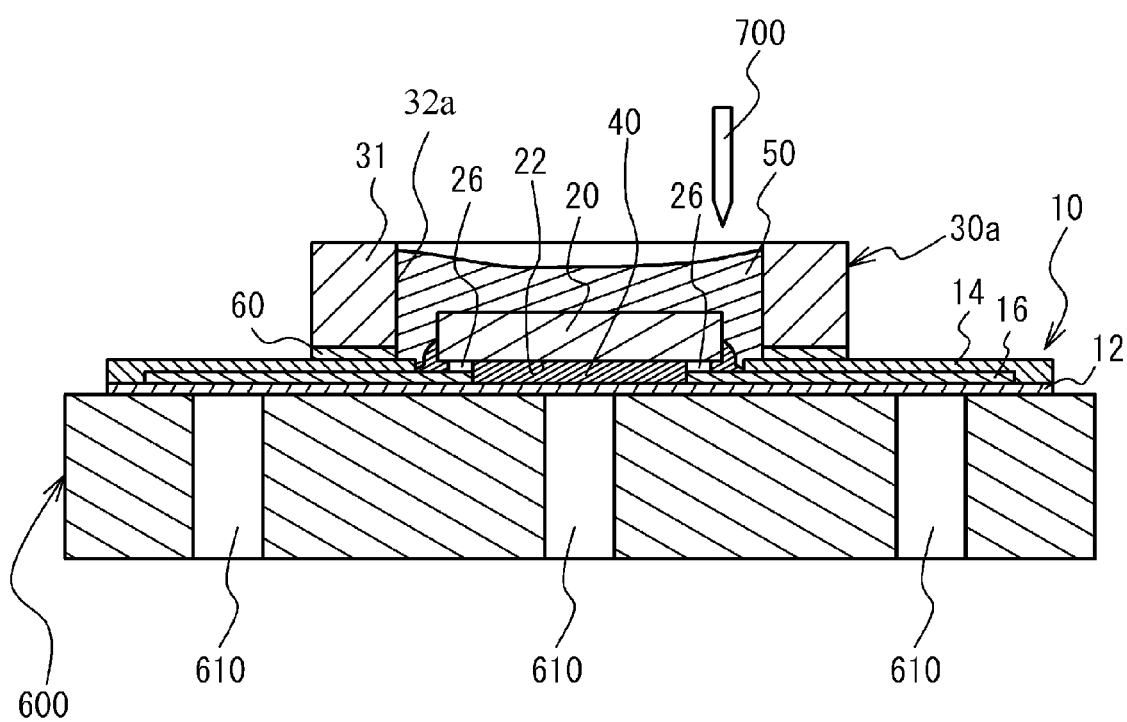
FIG. 9 is an explanatory view of the method for producing the fingerprint sensor.

Next, referring to FIG. 9, the resin 50 is potted within the reinforcing member 30a by an application nozzle 700 with the adsorbed state maintained. Then, the resin 50 is hardened with the adsorbed state maintained. Further, the resin 50, for example, is a thermosetting resin, and may be an ultraviolet curing resin. Furthermore, the resin 50 may be made of a material with small hardening shrinkage, for example, a material containing a larger amount of fillers. This is because the planarization of the FPC 10 is maintained.

In this way, the planarization of the FPC 10 is maintained with the adsorption stage 600, from the process in which the reinforcing member 30a is fixed on the FPC 10 to the process in which the resin 50 is hardened. Accordingly, the FPC 10 is planarized, whereby a test subject allows his/her finger to smoothly sweep. Incidentally, the detection accuracy of the fingerprint sensor 1a is improved. The external appearance of the fingerprint sensor 1a is also improved.

In addition, the reinforcing member 30a has a frame shape, thereby promoting discharge of a void generated in the resin 50 before the resin 50 is hardened.

Further, although the adsorption stage 600 is used in order to maintain the planarization of the FPC 10, the present invention is not limited to this configuration. For example, a porous stage having plural minute openings may be used.

The planarization of the FPC 10 may be maintained by an adhesive material. For example, the FPC 10 is attached on a member which has a metallic plate with projections and dents and which has a gelled resin coated on the metallic plate, so that the planarization of the FPC 10 is maintained. Furthermore, the FPC 10 may be maintained to flat by fixing the FPC 10 on a given stage with a double-faced tape.

Figure 10:
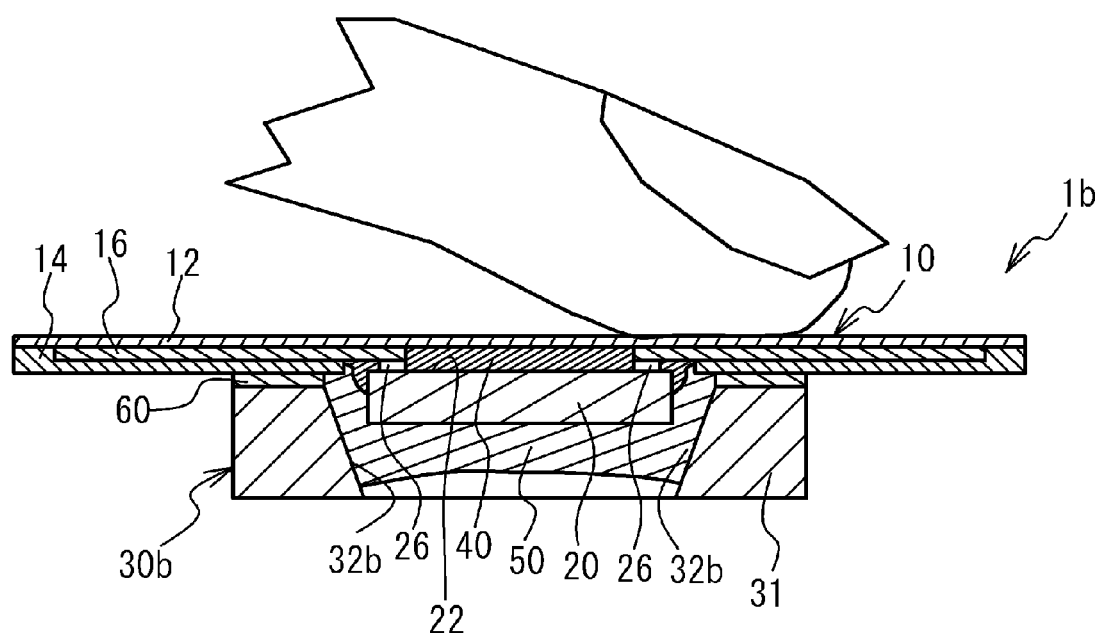
FIG. 10 is an explanatory view of the variation of the fingerprint sensor according to the second embodiment.

Next, a description will be given of a variation of the fingerprint sensor according to the second embodiment. FIGS. 10, and 11A to 11C are explanatory views of the variation of the fingerprint sensor according to the second embodiment. As illustrated in FIG. 10, an inner side surface 32b of a reinforcing member 30b is inclined with respect to the vertical direction. More specifically, the inner side surface 32b is inclined toward the inside of the reinforcing member 30b as apart from the FPC 10. With such an inclination prevents the resin 50 from falling out of the reinforcing member 30b. Additionally, for example, the inclined angle of the inner side surface 32b ranges from about 1 degree to about 10 degree with respect to the vertical direction. In a case where the inclined angle of the inner side surface 32b is excessive, a void may be generated in the resin 50 in the vicinity of the inner side surface 32b. The generation of the void may degrade the strength of the resin 50.

Figure 11A:
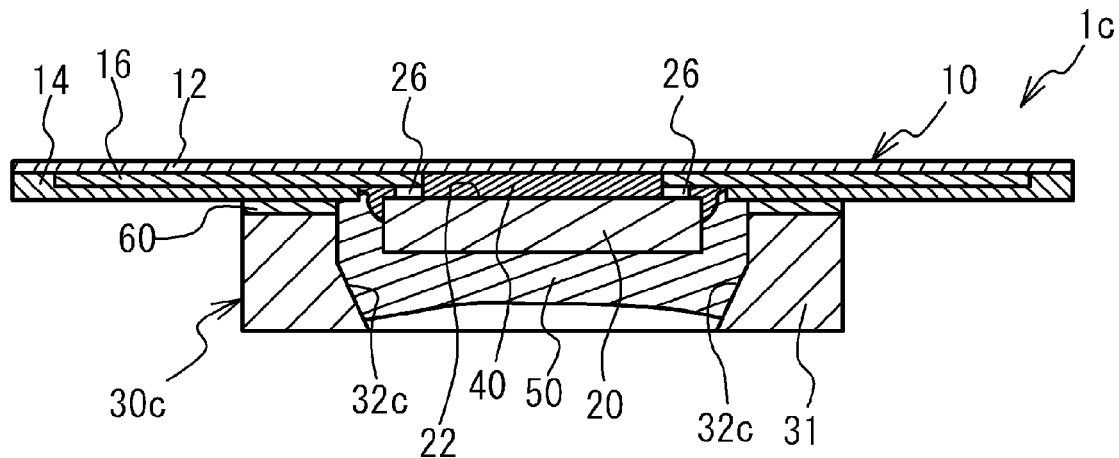
Figure 11B:
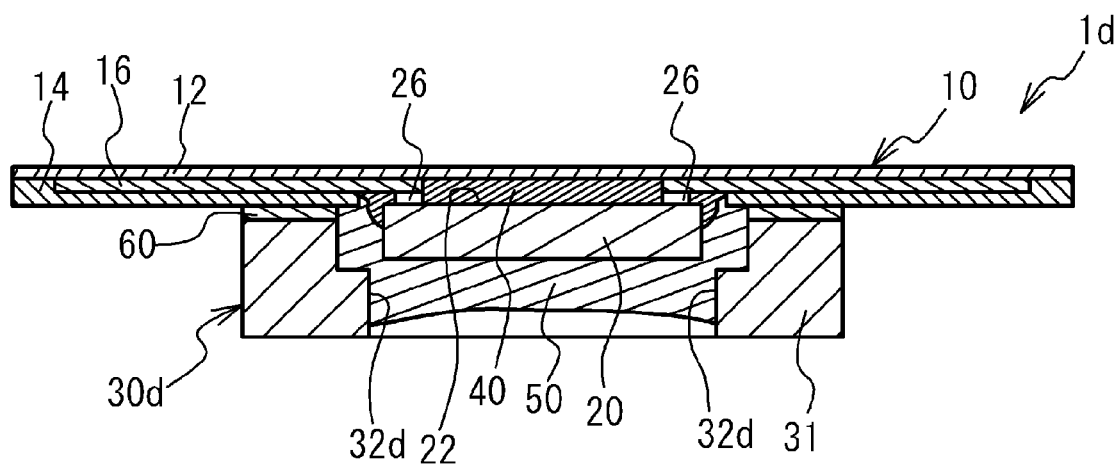
Figure 11C:
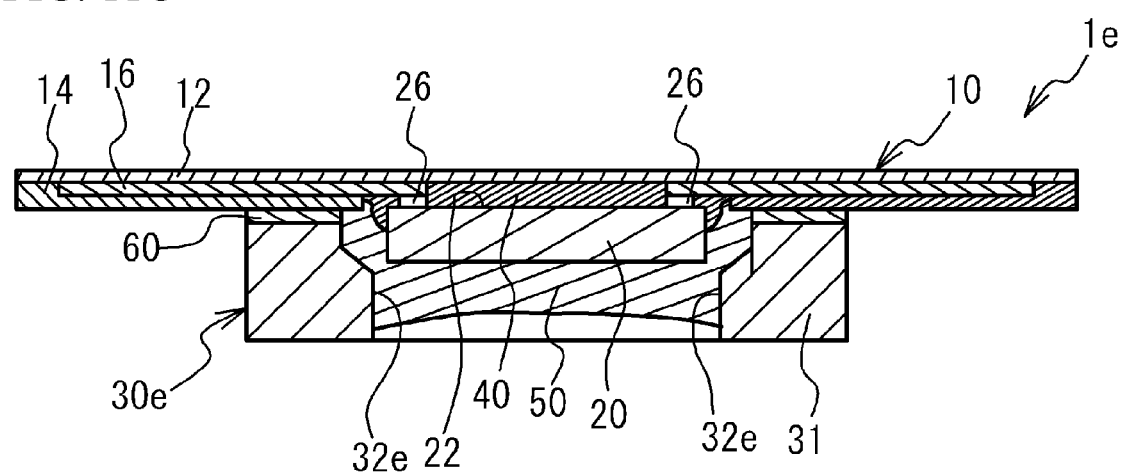

Further, in a fingerprint sensor 1c as illustrated in FIG. 11A, an inner side surface 32c has a section which is vertically extended and a section which is inclined. With such a shape of the inner side surface 32c can suppresses the generation of the void. In a fingerprint sensor 1d as illustrated in FIG. 11B, an inner side surface 32d extends toward the inner side of a reinforcing member 30c as apart from the FPC 10. The difference between the extending section as described above and the non extending section is from about 100 μm to about 2 mm. In a fingerprint sensor 1e as illustrated in FIG. 11C, an inner side surface 32e has an inclined section connecting the section extending to the inner side of a reinforcing member 30e and the section not extending. With such a configuration also suppresses the generation of the void.

Third Embodiment

Figure 12:
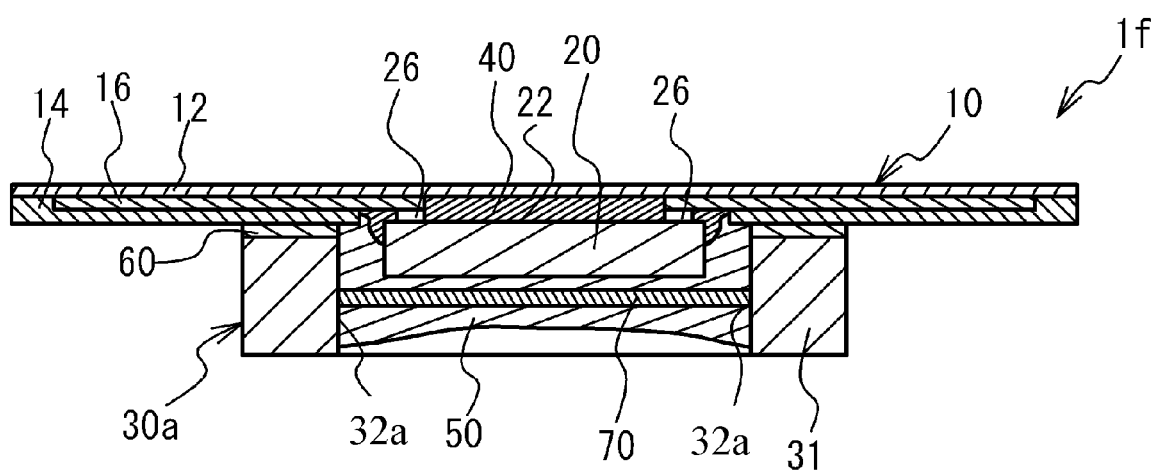
FIG. 12 is an explanatory view of the fingerprint sensor according to the third embodiment.
Figure 13A:
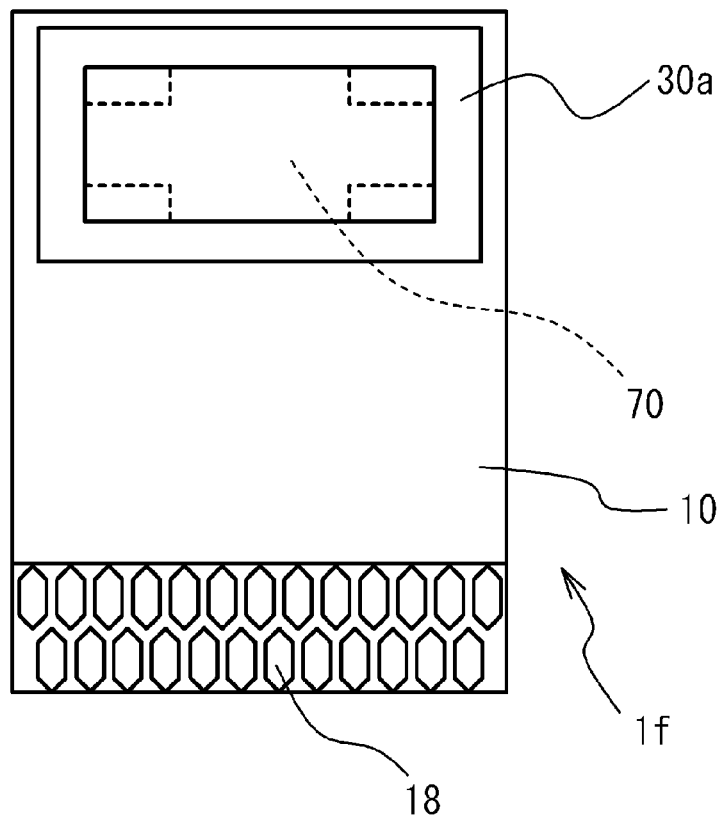
FIGS. 13A and 13B are explanatory views of the fingerprint sensor according to the third embodiment.
Figure 13B:
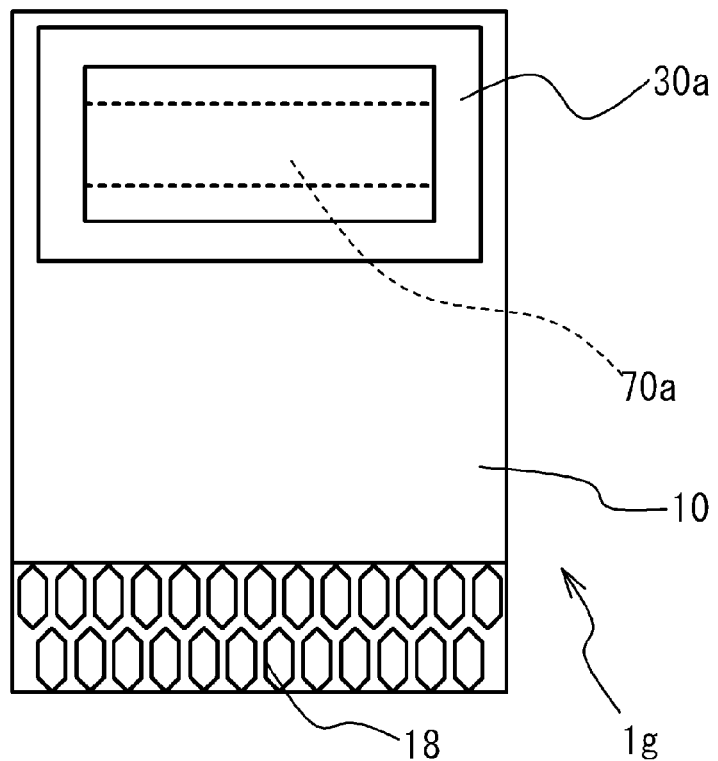

Next, a description will be given of a fingerprint sensor according to a third embodiment. FIGS. 12, and 13A and 13B are explanatory views of the fingerprint sensor according to the third embodiment. A fingerprint sensor 1f as illustrated in FIG. 12 is provided with a reinforcing plate 70 fitted into the inner side surface 32a of the reinforcing member 30a. The reinforcing plate 70 is made of a synthetic resin.

FIG. 13A is a front view of the fingerprint sensor 1f. The reinforcing plate 70 has a substantially cross shape, and is in contact with four surfaces of the inner side surface 32a of the reinforcing member 30a. This prevents the deformation of the reinforcing member 30a due to an external force. In this way, the fingerprint sensor 1f is hardly affected by the external force. Further, in a fingerprint sensor 1g illustrated in FIG. 13B, a reinforcing plate 70a has a substantially rectangular shape and is in contact with two opposing surfaces of the inner side surface 32a. Consequently, the deformation of the reinforcing member 30a is prevented.

Additionally, the reinforcing plate 70 is fitted into the reinforcing member 30a before the resin 50 is potted, and then the reinforcing member 30a is fixed on the FPC 10. Next, the resin 50 is potted into a gap between the reinforcing plate 70 and the reinforcing member 30a.

Additionally, the fingerprint sensor as mentioned above may be installed in a notebook computer or in an electronic device other than the notebook computer. The present invention is applicable to not only the fingerprint sensor as mentioned above but also a contact type sensor such as a touch panel.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the sprit and scope of the invention.

What is claimed is:

1. A contact sensor unit comprising:
   a flexible substrate having a conductive pattern;
   a sensor element having a detecting surface for detecting a fingerprint of a test subject, the sensor element having a terminal electrically connected to the conductive pattern, and the sensor element mounted on the flexible substrate to be covered with the flexible substrate;
   a reinforcing member fixed on the flexible substrate and surrounding the sensor element, and
   a resin arranged within the reinforcing member, and filled into a clearance between the reinforcing member and the sensor element to cover the sensor element and to seal an opening of the reinforcing member.

2. The contact sensor unit of claim 1, further comprising an underfill material filled between the flexible substrate and the detecting surface of the sensor element.

3. The contact sensor unit of claim 1, wherein the reinforcing member has a case shape.

4. The contact sensor unit of claim 1, wherein the reinforcing member has a frame shape.

5. The contact sensor unit of claim 1, wherein the reinforcing member has an inner side surface inclining toward the inside of the reinforcing member as apart from the flexible substrate.

6. The contact sensor unit of claim 1, wherein the reinforcing member has an inner side surface protruding toward the inside of the reinforcing member as apart from the flexible substrate.

7. The contact sensor unit of claim 1, further comprising: a reinforcing plate fitted in the reinforcing member.

8. An electronic device comprising:
a contact sensor unit comprising:
   a flexible substrate having a conductive pattern;
   a sensor element having a detecting surface for detecting a fingerprint of a test subject, the sensor element having a terminal electrically connected to the conductive pattern, and the sensor element mounted on the flexible substrate to be covered with the flexible substrate;
   a reinforcing member fixed on the flexible substrate and surrounding the sensor element,
   a resin arranged within the reinforcing member, and filled into a clearance between the reinforcing member and the sensor element to cover the sensor element and to seal an opening of the reinforcing member, and
   a chassis attached with the contact sensor unit.

9. A method for producing a contact sensor unit, comprising:
   mounting a sensor element on a flexible substrate;
   bonding a reinforcing member on the flexible substrate to surround the sensor element while a planarization of the flexible substrate is maintained;
   potting a resin within the reinforcing member to be filled into a clearance between the reinforcing member and the sensor element, to cover the sensor element, and to seal an opening of the reinforcing member, and
   hardening the resin.

* * * * *